United States Patent
Hayashi et al.

(10) Patent No.: US 6,567,490 B1
(45) Date of Patent: May 20, 2003

(54) PULSE SIGNAL DELAY CIRCUIT

(75) Inventors: Koji Hayashi, Hashima (JP); Toru Akiyama, Gifu-ken (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/273,182

(22) Filed: Mar. 19, 1999

(30) Foreign Application Priority Data

Mar. 30, 1998 (JP) .......................................... 10-083635

(51) Int. Cl.[7] ................................................. H03D 3/24
(52) U.S. Cl. ........................ 375/376; 375/371; 375/373
(58) Field of Search ............................... 375/376, 371, 375/373, 374; 331/1 A, 34; 327/161, 291, 295

(56) References Cited

U.S. PATENT DOCUMENTS

| | | | | |
|---|---|---|---|---|
| 5,309,035 A | * | 5/1994 | Watson, Jr. et al. | ........ 307/269 |
| 5,621,774 A | | 4/1997 | Ishibashi et al. | ............ 375/371 |
| 5,764,092 A | * | 6/1998 | Wada et al. | ................. 327/271 |
| 5,878,097 A | * | 3/1999 | Hase et al. | .................. 375/371 |
| 6,173,432 B1 | * | 1/2001 | Harrison | ......................... 716/1 |
| 6,188,252 B1 | * | 2/2001 | Kawakami | .................. 327/101 |

* cited by examiner

Primary Examiner—Mohammad H. Ghayour
(74) Attorney, Agent, or Firm—Fish & Richardson P.C.

(57) ABSTRACT

A pulse delay circuit includes a delay circuit, a plurality of selectors and a plurality of synchronous circuits. The delay circuit includes a plurality of series connected delay elements for delaying a clock signal and generating a plurality of delay clock signals. Each of the selectors is connected to the plurality of delay elements and selects one of the plurality of the delay clock signals in accordance with an associated selection signal. The plurality of synchronous circuits receive pulse signals and the selected delay clock signals and generating a plurality of synchronous pulse signals that are synchronized with the selected delay clock signals, respectively.

6 Claims, 9 Drawing Sheets

PULSE SIGNAL DELAY CIRCUIT

BACKGROUND OF THE INVENTION

The present invention generally relates to a pulse signal delay circuit, and, more particularly, to a pulse signal delay circuit including a plurality of delay elements.

In general, a pulse signal delay circuit includes a plurality of delay elements connected in series. In a CMOS semiconductor device, a delay element is formed by an inverter comprising a P-channel MOS transistor and an N-channel MOS transistor. A selector is preferably connected to a plurality of delay elements and selects one of delay outputs from the plurality of delay elements. Accordingly, the delay time of an input signal is determined. A comparator may be used instead of the inverter. However, in order to change the delay time in each of a plurality of input pulse signals, the conventional delay circuit requires the same number of delay circuits and selectors, as the input pulse signals. Hence, the area of the delay circuit is quite large.

The delay circuit may be formed by a plurality of series connected D type flip-flops (D-FF) each of which operates in synchronism with a clock signal. In this case, a high-speed clock is required to finely set the delay time of the clock signal. In fact, it is difficult to supply the high-speed clock signal and to prepare a D-FF that operates stably in synchronism with the high-speed clock signal.

It is an object of the present invention to provide a pulse signal delay circuit having a reduced circuit area.

SUMMARY OF THE INVENTION

In one aspect of the present invention, a pulse delay circuit provided that includes a delay circuit, a plurality of selectors and a plurality of synchronous circuits. The delay circuit includes a plurality of series connected delay elements for delaying a clock signal and generating a plurality of delay clock signals. Each of the plurality of selectors is connected to the plurality of delay elements and selects one of the plurality of the delay clock signals in accordance with an associated selection signal. The plurality of synchronous circuits are connected to the plurality of selectors, respectively. The plurality of synchronous circuits receive pulse signals and the selected delay clock signals and generate a plurality of synchronous pulse signals that are synchronized with the selected delay clock signals, respectively.

In another aspect of the present invention, a pulse signal control circuit is provided that includes a first synchronous circuit for receiving an input signal and a clock signal and generating a first synchronous input signal that is synchronized with the clock signal. A waveform shaping circuit waveform-shapes the first synchronous input signal and generates a waveform-shaped input signal. A plurality of second synchronous circuits receive a plurality of input pulse signals and the clock signal and generate a plurality of second synchronous input pulse signals that are synchronized with the clock signal. A delay circuit includes a plurality of delay elements for delaying the clock signal and generating a plurality of delay clock signals. Each of a plurality of selectors selects one of the plurality of delay clock signals in accordance with an associated selection signal. A plurality of third synchronous circuits receive the plurality of second synchronous input pulse signals and the selected delay clock signals and generate a plurality of third synchronous input pulse signals that are synchronized with the selected delay clock signals, respectively. A plurality of logic circuits receive the waveform-shaped input signal and the plurality of third synchronous input pulse signals and generate a plurality of pulse signals that are synchronized with the waveform-shaped input signal.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
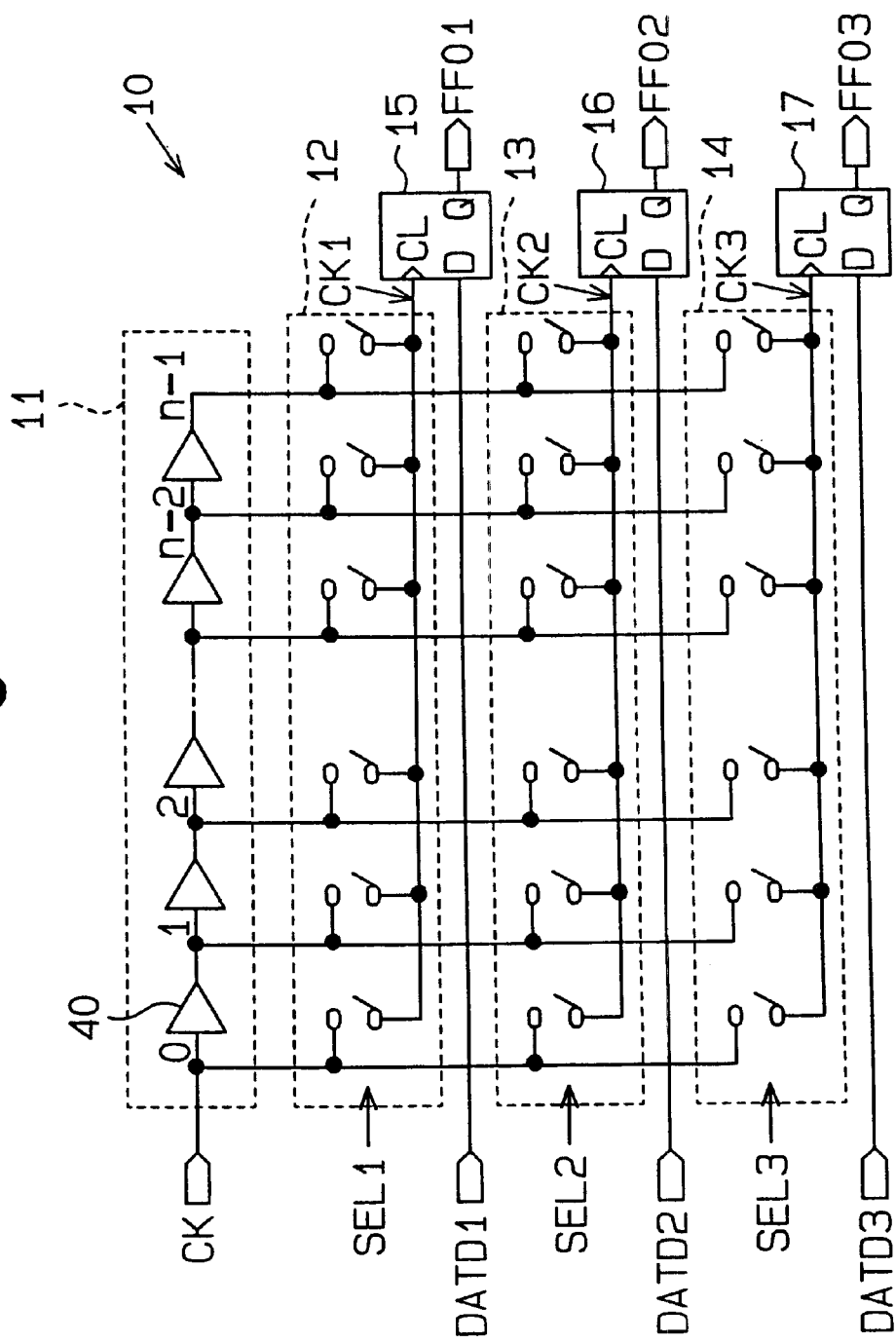
FIG. 1 is a block diagram of a pulse delay circuit according to a first embodiment of the present invention.

FIG. 1 is a block diagram of a pulse delay circuit 10 according to a first embodiment of the present invention. The pulse delay circuit 10 includes a delay circuit 11 including a plurality of delay elements 40 connected in series, three selectors 12, 13 and 14 connected in parallel to the delay circuit 11, and three D-FF 15, 16, and 17 connected to the selectors 12–14, respectively.

Each delay element 40 is preferably an inverter. The delay circuit 11 receives a clock signal CK and generates a delay clock signal. The selectors 12–14 receive delay output signals from the plurality of delay elements 40 and select any one of the plurality of delay output signals in response to three selection signals SEL1, SEL2, and SEL3, thereby supplying three delay clock signals CK1, CK2, CK3 to the D-FFs 15–17, respectively.

The D-FFs 15–17 have clock terminals CL for receiving three delay clock signals CK1, CK2, and CK3, respectively and data terminals D for receiving three pulse signals DATD1, DATD2, and DATD3, respectively.

Specifically, the delay circuit 11 includes the sixteen series connected delay elements 40. Accordingly, assuming the cycle of the clock signal CK is "T", the delay time dt of each delay element 40 is set to T/16. For example, when the selection signal SEL1, SEL2, or SEL3 is "4", the delay output signal of the fourth delay element 40 is selected and the delay time of the delay output signal is 0.25T (4T/16).

Figure 3:
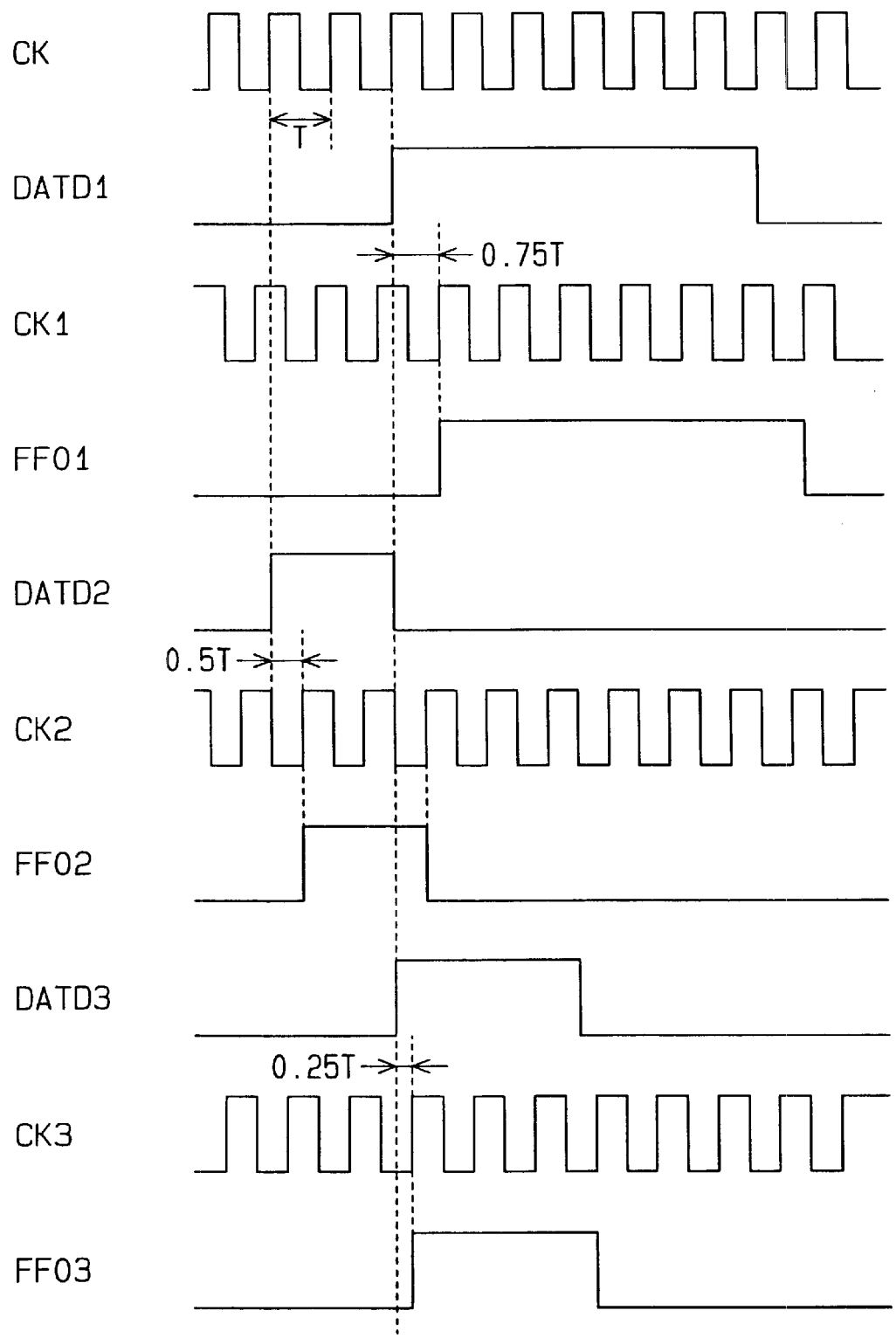
FIG. 3 is a timing chart describing the operation of the pulse delay circuit of FIG. 1.

FIG. 3 is a timing chart describing the operation of the pulse delay circuit 10. As shown in FIG. 3, the pulse delay circuit 10 delays the input signals DATD1, DATD2, and DATD3 by different delay time.

Specifically, the clock signal CK is supplied to the delay circuit 11, and the mutually different data signals (input pulse signals) DATD1–DATD3 are supplied to the D-FFs 15–17, respectively. At this time, the selection signals SEL1 "12", SEL2 "8", and SEL3 "4" are assumed to be sent to the selectors 12, 13, and 14, respectively.

The delay clock signal CK1 of the 12th stage delay element 40 is selected by the first selector 12. The delay time dt1 of the delay clock signal CK1 is 0.75T (12T/16). A first output pulse signal FFO1 that has a delay of 0.75T from the first input pulse signal DATD1 is output from the D-FF 15. Thus, the first input pulse signal DATD1 is synchronized with the delay clock signal CK1.

The delay clock signal CK2 of the 8th stage delay element 40 is selected by the second selector 13. The delay time dt2 of the delay clock signal CK2 is 0.5T (8T/16). A second output pulse signal FFO2 that has a delay of 0.5T from the second input pulse signal DATD2 is output from the second D-FF 16. Thus, the second input pulse signal DATD2 is synchronized with the delay clock signal CK2.

The delay clock signal CK3 of the 4th stage delay element 40 is selected by the third selector 14. The delay time dt3 of the delay clock signal CK3 is 0.25T (4T/16). A third output pulse signal FFO3 that has a delay of 0.25T from the third input pulse signal DATD3 is output from the third D-FF 17. Thus, the third input pulse signal DATD3 is synchronized with the delay clock signal CK3. As described above, the pulse delay circuit 10 delays the input pulse signals by different delay times, respectively. That is, by changing the selection signals SEL1, SEL2, and SEL3, the delay times of the input pulse signals are changed in the unit of T/16. Further, by increasing the number of the delay elements 40 and decreasing the delay time of one delay element 40, it is possible to set the delay times of the input pulse signals, finely.

Figure 2:
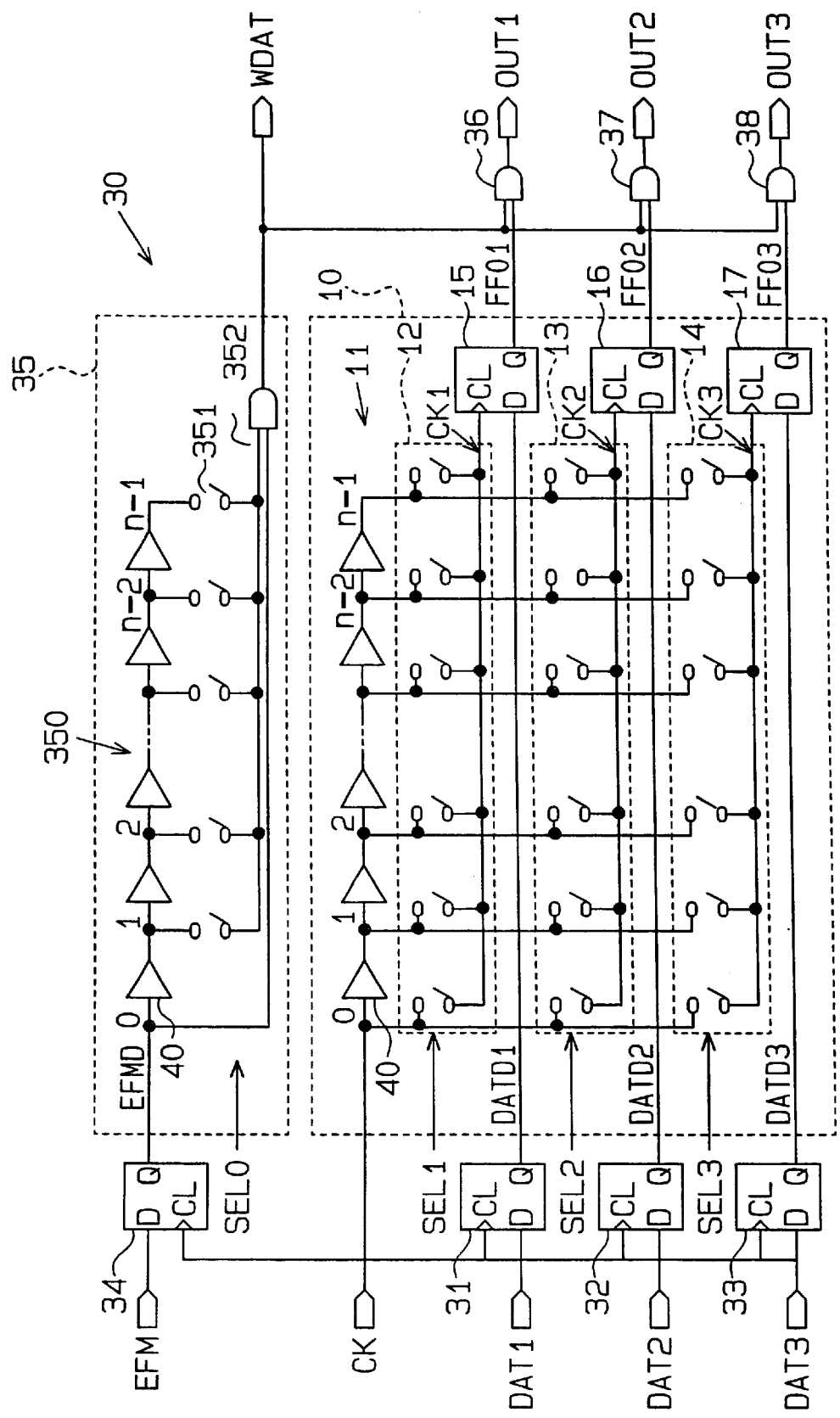
FIG. 2 is a block diagram of a pulse control circuit according to a second embodiment of the present invention.

FIG. 2 is a block diagram of a pulse control circuit 30 according to a second embodiment of the present invention. The pulse control circuit 30 includes the pulse delay circuit 10 of FIG. 1 and is preferably used in a CD-R (compact disc-recordable). For example, in a writeable optical disk drive, such as the CD-R, the waveform of an EFM signal is shaped by delay processing of the EFM signal. A laser device receives the waveform-shaped EFM signal and records a predetermined recording mark on an optical disk. Data is recorded according to recording status, which varies depending on the type of media and the rotational speed of the disk. In other words, the waveform shape of the EFM signal is necessarily whenever the recording status is varies depending on the type of media and the rotational speed of the disk. A plurality of pulse signals generated by the pulse delay circuit 10 are used for monitoring a laser output. The plurality of pulse signals are synchronized with the waveform-shaped EFM signal and have the predetermined relationship with the EFM signal.

The pulse control circuit 30 includes four D-FFs 31, 32, 33, and 34, a waveform shaping circuit 35, and three AND gates 36, 37, and 38. The D-FFs 31, 32, and 33 have data terminals D for receiving the pulse signals DAT1, DAT2, and DAT3 and clock terminals CL for receiving the clock signal CK, and output terminals Q connected to the data terminals D of the D-FFs 15–17. The data terminal D of the D-FF 34 receives the EFM signal, the clock terminal CL receives the clock signal, and the output terminal Q is connected to the input of the waveform shaping circuit 35.

The waveform shaping circuit 35 waveform-shapes the output signal (EFM signal) of the D-FF 34 and generates the waveform-shaped EFM signal. The AND gates 36–38 have first input terminals for receiving the output signals FFO1, FFO2, and FFO3 of the D-FFs 15–17 and second input terminals for receiving an output pulse signal WDAT of the waveform shaping circuit 35.

The waveform shaping circuit 35 includes a delay circuit 350, a selector 351, and an AND gate 352. The delay circuit 350 includes a plurality of delay elements 40 connected in series and delays the rising edge of the EFM signal. The falling edge as well as the rising edge of the EFM signal may be delayed by a predetermined time by adding an additional delay circuit, selector, and logic circuit to the waveform shaping circuit 35. Each delay element 40 is preferably an inverter. The selector 351 receives the delay output signals from the plurality of delay elements 40 of the delay circuit 350 and selects one of the delay output signals in accordance with a selection signal SEL0. The AND gate 352 performs a logical AND operation on the EFMD signal and the selected delay output signal.

Figure 4:
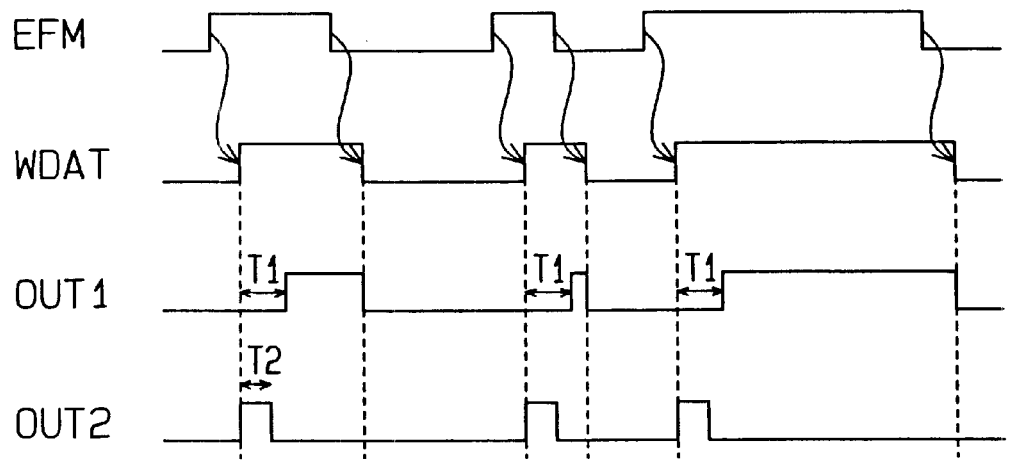
FIG. 4 is a timing chart describing the operation of the pulse control circuit of FIG. 2.

FIG. 4 is a timing chart describing the operation of the pulse control circuit 30. The pulse control circuit 30 generates a plurality of pulse signals which synchronize with the output pulse signal WDAT of the waveform shaping circuit 35 and have a predetermined relationship with the output pulse signal WDAT. When the EFM signal is supplied to the waveform shaping circuit 35, delay processing of the EFM signal is performed and the waveform-shaped output pulse signal WDAT is output from the waveform shaping circuit 35. A first pulse signal OUT1 that rises after a predetermined cycle T1 has elapsed from the rising edge of the output pulse signal WDAT and falls substantially simultaneously with the output pulse signal WDAT, is output from the first AND gate 36. Further, a second pulse signal OUT2 that rises substantially simultaneously with the output pulse signal WDAT and falls after a predetermined cycle (pulse width T2) has elapsed, is output from the second AND gate 37.

Figure 5:
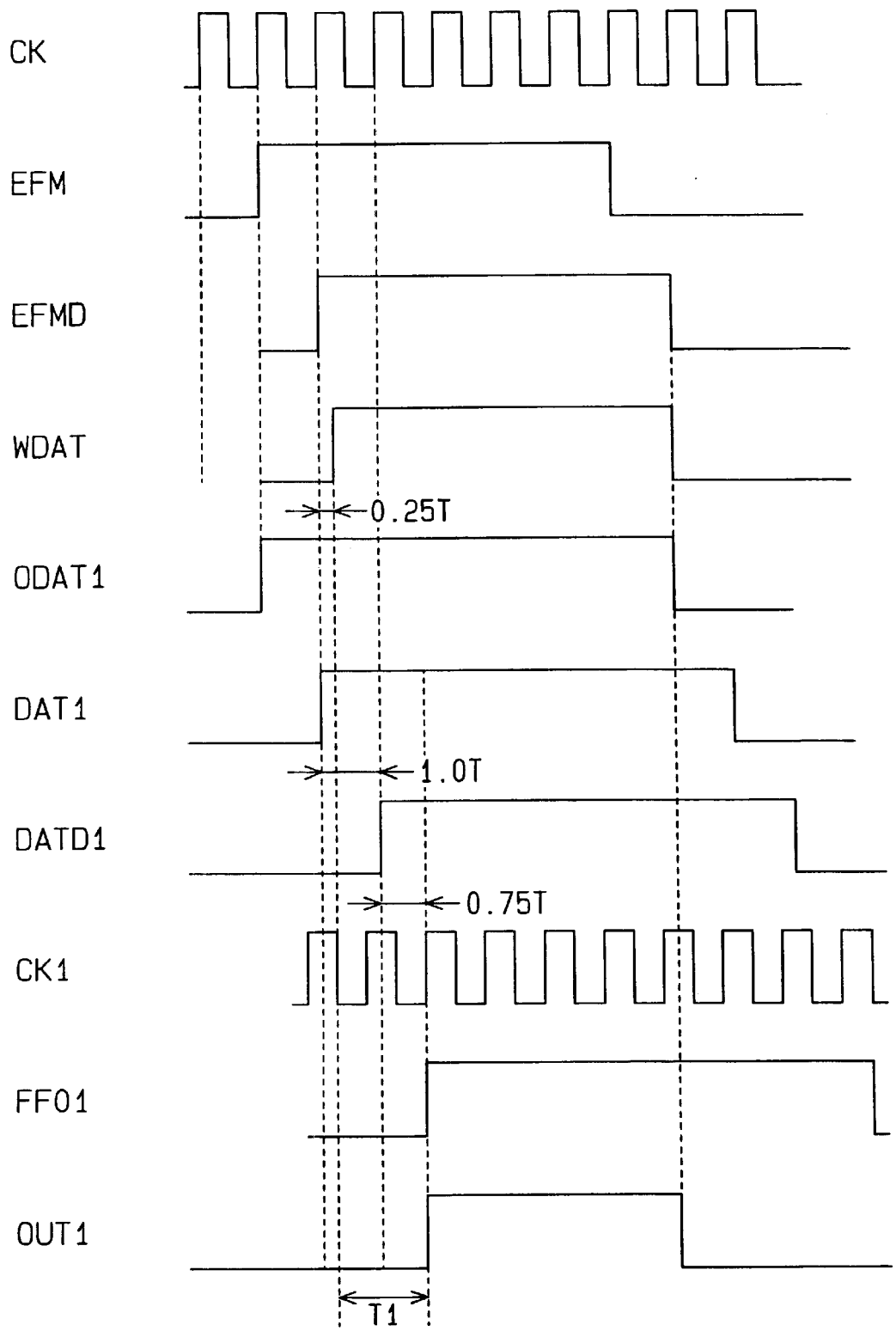
FIG. 5 is a more detailed timing chart of the operation of the pulse control circuit of FIG. 2.
Figure 6:
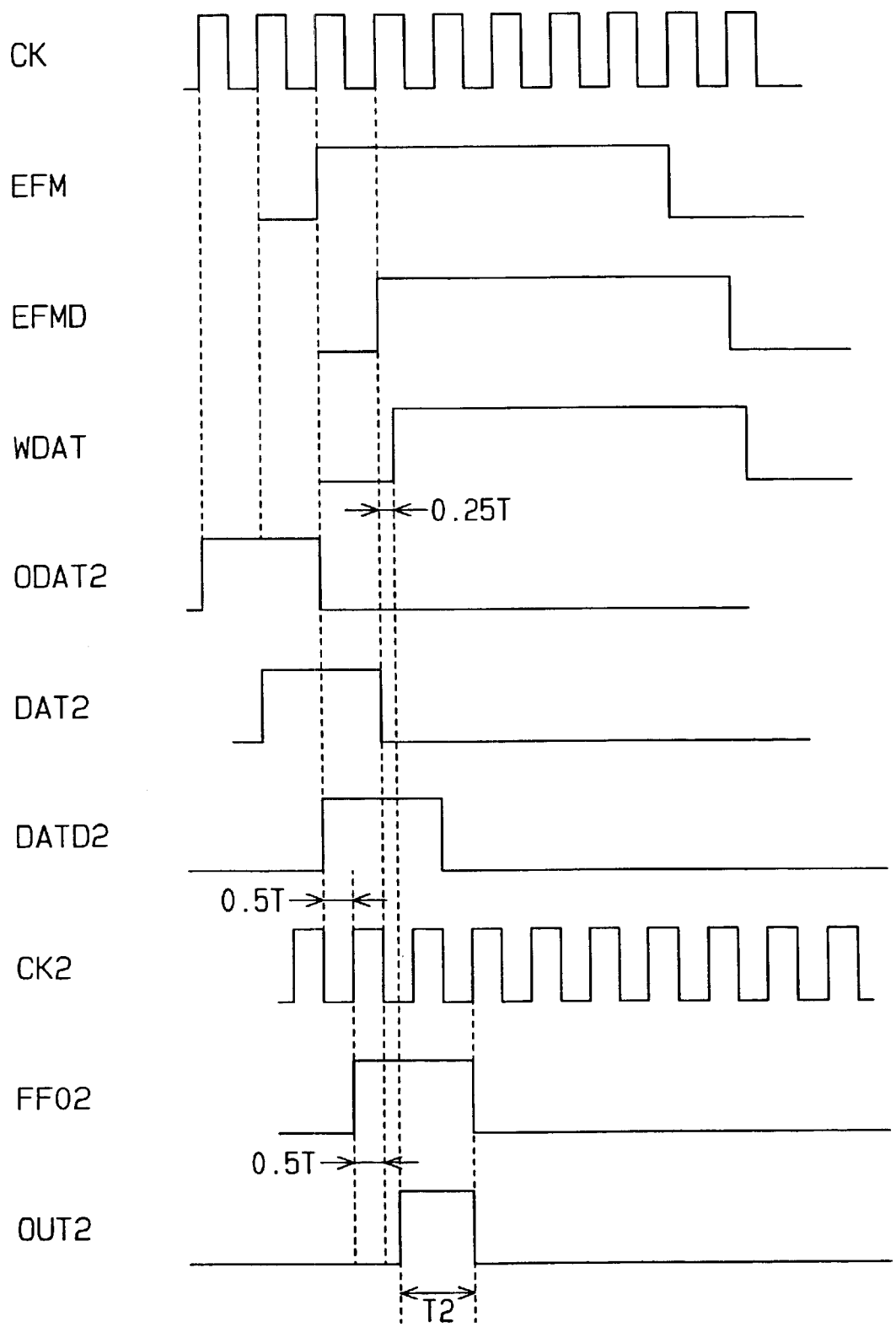
FIG. 6 is another timing chart of the operation of the pulse control circuit of FIG. 2.

FIGS. 5 and 6 are timing charts describing the generation of the first and second pulse signals OUT1 and OUT2.

When the EFM signal having a pulse width 6T (i.e., 6 cycles) is supplied to the D-FF 34, the delay EFM signal EFMD, which is 1.0T delay of the EFM signal, is generated by the D-FF 34. Where, assume a selection signal SEL0 "4" is supplied to the selector 351. The delay output signal having the delay time dt4 "0.25T" from the 4th stage delay element 40 is selected by the selector 351. The AND gate 352 performs an AND operation on the 4th delay output signal and the delay EFM signal EFMD and generates the output pulse signal WDAT. The output pulse signal WDAT rises 0.25T later than the delay EFM signal EFMD and falls at the same time as the delay EFM signal EFMD.

When the first input pulse signal DAT1 is supplied to the D-FF 31, the first delay input pulse signal DATD1, which is 1.0T delay of the first input pulse signal DAT1, is generated. The first input pulse signal DAT1 is generated by delaying by 1.0T a pulse signal ODAT1 which rises simultaneously with the EFM signal and falls 1.0T after the EFM signal.

As shown in FIG. 6, when the second input pulse signal DAT2 is supplied to the D-FF 32, the second delay input pulse signal DATD2, which is 1.0T delay of the second input pulse signal DAT2, is generated. The second input pulse signal DAT2 is generated by delaying by 1.0T a pulse signal ODAT2 which has a constant pulse width 2.0T and falls at the same time as the rising edge of the EFM signal.

For example, when the predetermined cycle T1 of the first pulse signal OUT1 is set to "1.5T" and the pulse width T2 of the second pulse output signal OUT2 is set to "1.25T", the first and second selection signals SEL1 "12" and SEL2 "8" are supplied to the selectors 12 and 13, respectively.

As shown in FIG. 5, the delay clock signal CK1 delayed by 0.75T (12.0T/16) is selected by the selection signal SEL1 "12", and the delay clock signal CK1 is supplied to the D-FF 15. Thus, the first output pulse signal FFO1, which has a delay of 0.75T of the first delay input pulse signal DATD1, is output from the D-FF 15. The AND gate 36 performs an AND operation on the first output pulse signal FFO1 and the output pulse signal WDAT and generates the first pulse signal OUT1. The first pulse signal OUT1 rises simultaneously with the first output pulse signal FFO1 and falls simultaneously with the output pulse signal WDAT. The predetermined cycle T1 from the rising edge of the output pulse signal WDAT to the rising edge of the first pulse signal OUT1 is 1.5T ((1.0T+0.75T)−0.25T). That is, the predetermined cycle T1 is obtained from the cycle "1.0T" from the rising edge of the first input pulse signal DAT1 to the rising edge of the first delay input pulse signal DATD1, the cycle "0.75T" from the first delay input pulse signal DATD1 to the rising edge of the first output pulse signal FFO1, and the cycle "0.25T" from the rising edge of the first input pulse signal DAT1 to the rising edge of the output pulse signal WDAT.

As shown in FIG. 6, the delay clock signal CK2 delayed by 0.5T (8T/16) is selected by the selection signal SEL2 "8", and the delay clock signal CK2 is supplied to the D-FF 16. Thus, the second output pulse signal FFO2, which is 0.5T delay of the second delay input pulse signal DATD2, is output from the second D-FF 16. The second AND gate 37 performs an AND operation on the second output pulse signal FFO2 and the output pulse signal WDAT and generates the second pulse signal OUT2. The second pulse signal FFO2 rises simultaneously with the output pulse signal WDAT and falls simultaneously with the second pulse signal FFO2. The pulse width T2 of the second pulse signal OUT2 is 1.25T (2.0T−0.75T). That is, the predetermined pulse width T2 is obtained by subtracting a cycle "0.75T" from a pulse width "2.0T" of the second output pulse signal FFO2. The cycle 0.75T is from the rising edge of the second output pulse signal FFO2 to the rising edge of the output pulse signal WDAT. The cycle "0.75T" is obtained by adding a cycle "0.5T" and a cycle "0.25T". The cycle "0.5T" is from the rising edge of the second output pulse signal FFO2 to the rising edge of the delay EFM signal EFMD. The cycle "0.25T" is from the rising edge of the delay EFM signal EFMD to the rising edge of the output pulse signal WDAT. The cycle "0.5T" is obtained by subtracting a second cycle "0.5T" from a cycle "1.0T". The second cycle "0.5T" is from the rising edge of the second delay input pulse signal DATD2 to the rising edge of the second output pulse signal FFO2. The cycle "1.0T" is from the rising edge of the second delay input pulse signal DATD2 to the rising edge of the delay EFM signal EFMD.

Figure 7:
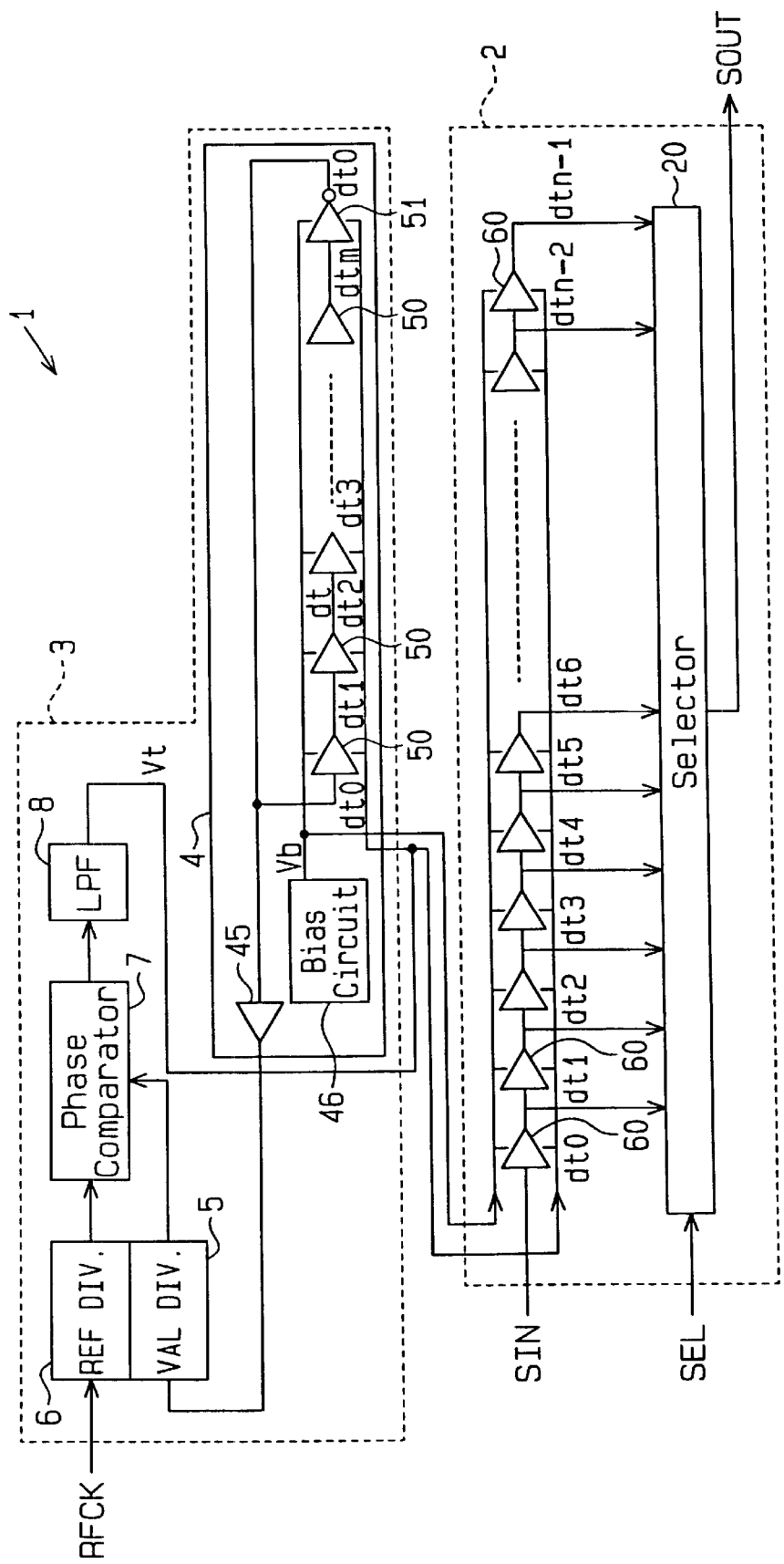
FIG. 7 is a block diagram of a delay circuit according to a third embodiment of the present invention.

The delay time of the delay elements 40 of the delay circuits 11 and 350 is not uniform due to the unevenness of the transistor characteristics of the delay elements 40. FIG. 7 is a block diagram of a delay circuit 1 suitable for obtaining a highly accurate and substantially uniform delay time. The delay circuit 1 includes a delay line 2 for generating a delay input signal, a PLL circuit 3 for controlling the delay time of the delay line 2, and a selector 20. The selector 20 has the same configuration as the selectors 12, 13, and 14 of FIG. 1 and the selector 351 of FIG. 2.

The PLL circuit 3 includes a voltage-controlled oscillator (VCO) 4, a programmable divider 5, a reference divider 6, a phase comparator 7, and a low pass filter 8. The VCO 4 generates an oscillation output signal having a frequency that varies in accordance with a control voltage Vt. The programmable divider 5 frequency-divides the oscillation output signal of the VCO 4 into 1/N and generates a frequency-divided oscillation output signal. The reference divider 6 frequency-divides a reference signal RFCK into 1/M and generates a frequency-divided reference signal. The phase comparator 7 compares the phase of the frequency-divided oscillation output signal and the phase of the frequency-divided reference signal and generates a phase difference detection signal. The low pass filter 8 supplies the control voltage Vt according to the phase difference detection signal to the VCO 4. The frequency division ratio of the programmable divider 5 and the reference divider 6 is changeable. A charge pump (not illustrated) is provided between the phase comparator 7 and the LPF 8.

The VCO 4 includes a plurality of delay cells 50 and 51 connected in series and has a ring or loop shaped configuration in which the output of the final-stage delay cell 51 is negatively fed back to the initial-stage delay cell 50. The output signal of the final-stage delay cell 51 is supplied to the programmable divider 5 via a buffer 45. The respective delay cells 50 and 51 have first and second control terminals. A predetermined bias voltage Vb is supplied from a bias circuit 46 to the first control terminal, and the control voltage Vt from the low pass filter 8 is supplied to the second control terminal.

The delay line 2 includes a plurality of delay cells 60 connected in series. Each delay cell 60 has the same configuration as the delay cell 50. The first-stage delay cell 60 receives an input signal SIN supplied from an external device (not illustrated). The selector 20 selects any one of the delay output signals from a plural of the delay cells 60 and outputs a delay signal SOUT. The delay cells 50 and 51 of the VCO 4 and the delay cells 60 of the delay line 2 are arranged to be in close proximity. The delay characteristics of the delay cells 50, 51, and 60 are substantially the same.

Figure 8:
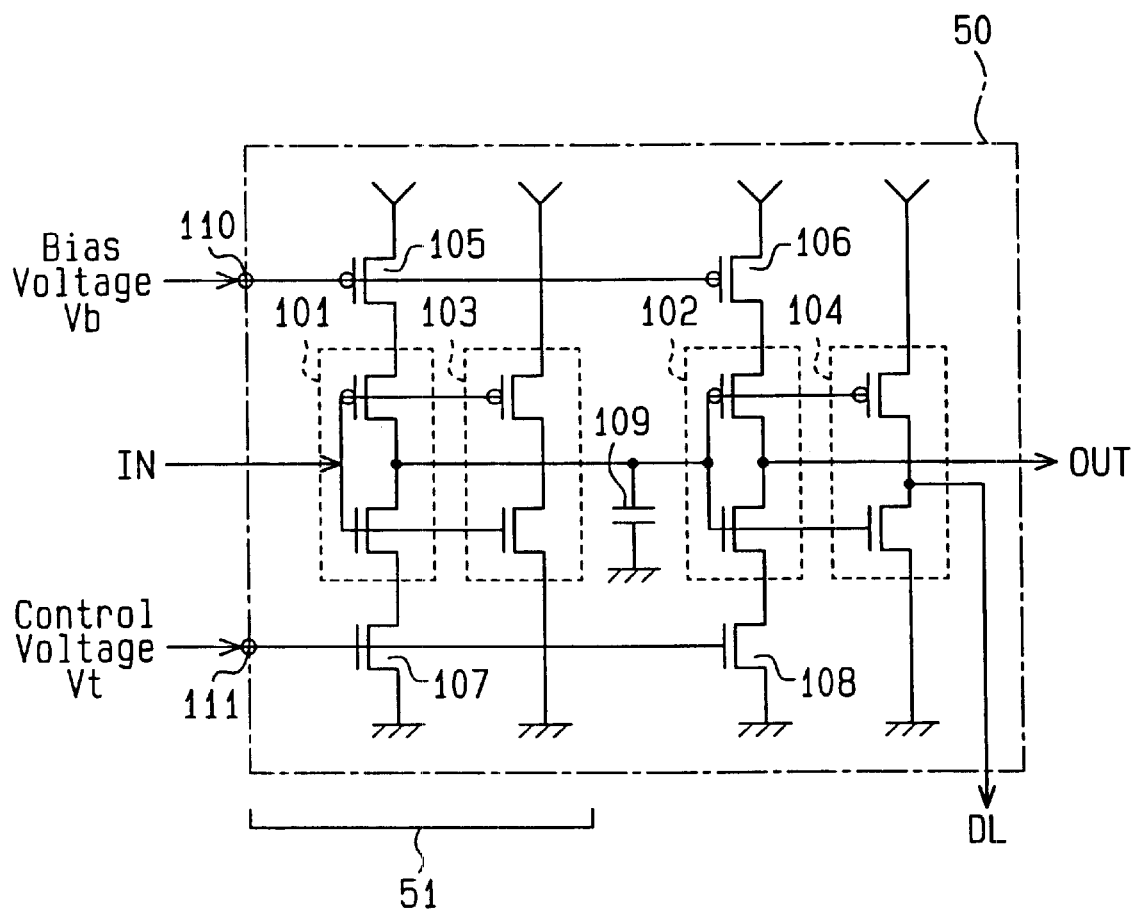
FIG. 8 is a circuit diagram of a delay cell of the delay circuit of FIG. 7.

FIG. 8 is a circuit diagram of the delay cell 50. The delay cell 50 includes first and second inverters 101 and 102 connected in series and first and second buffers 103 and 104 connected to the first and second inverters 101 and 102, respectively. Each of the first and second inverters 101 and 102 includes a P-channel MOS transistor and an N-channel MOS transistor that are connected in series. Current-controlled P-channel MOS transistors 105 and 106 are connected between a power potential and the first and second inverters 101 and 102, respectively. Current-controlled N-channel MOS transistors 107 and 108 are connected between a ground potential and the first and second inverters 101 and 102, respectively. The gate of the current-controlled N-channel MOS transistor 105 is connected to a first control terminal 110, and the gate of the current-controlled N-channel MOS transistor 107 is connected to a second control terminal 111. A parasitic capacitor 109 is connected between the ground potential and a node between the first and second inverters 101 and 102.

The predetermined bias voltage Vb from the bias circuit 46 is applied to the first control terminal 110, and the control voltage Vt from the low pass filter 8 is applied to the second control terminal 111. When the control voltage Vt increases, the current flowing in the inverters 101 and 102 increases and a delay time dt of an input signal IN decreases. When the control voltage Vt decreases, the current flowing in the first and second inverters 101 and 102 decreases and the delay time dt of the input signal IN increases. The delay time dt of the delay cell 50 varies in accordance with the control voltage Vt.

The final-stage delay cell 51 includes only the first inverter 101, the first buffer 103, and the current-controlled P-channel and N-channel MOS transistors 105 and 107. Accordingly, the output signal of the first inverter 101 of the final-stage delay cell 51 is fed back to the input of the first inverter 101 of the first-stage delay cell 50.

Next, the operation of the delay circuit 1 will be described. A frequency f1 of the oscillation output signal of the VCO 4 is frequency-divided into f1/N by the programmable divider 5, and a frequency f0 of the reference signal is frequency-divided into f0/M by the reference divider 6. The phases of two frequency division signals are compared by the phase comparator 7, and the control voltage Vt according to the phase difference is supplied from the low pass filter 8 to the VCO 4. The PLL circuit 3 operates such that the phase difference of the frequency division signals from the dividers 5 and 6 disappears. When the PLL circuit 3 is locked, the following equation (1) is established.

$$f1/N = f0/M \qquad (1)$$

Figure 9:
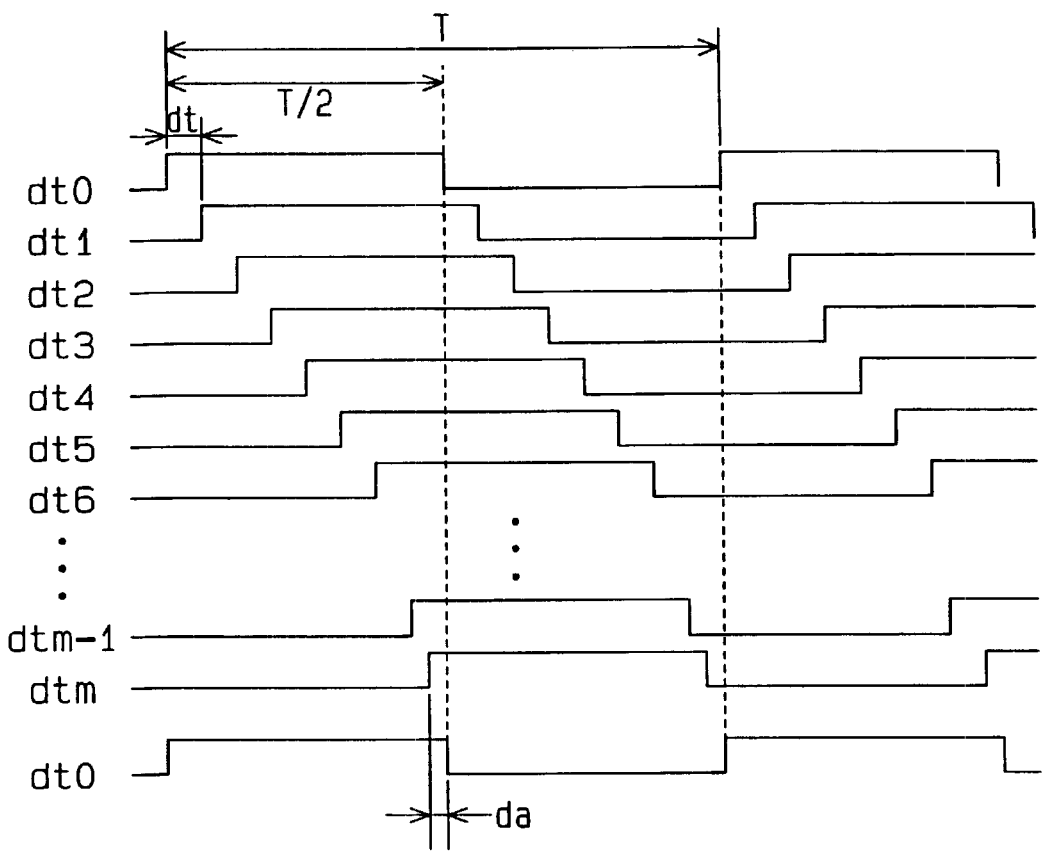
FIG. 9 is a timing chart describing the operation of a VCO of the delay circuit of FIG. 7.

The delay time dt of each delay cell 50 is determined in accordance with the control voltage Vt. As shown in FIG. 9, a signal dt0 supplied to the initial-stage delay cell 50 is delayed by the delay time dt while it is passing through each latter-stage delay cell 50. The output signal of the initial-stage delay cell 50 is reversed by the final-stage delay cell 51, and the resulting inverse signal is delayed by loopback delay d and fed back to the first-stage delay cell 50. When the loopback delay d is far smaller than the delay time dt, the delay time dt is represented by the following equation (2).

$$T/2 = dt \cdot D \qquad (2)$$

That is, the value obtained by adding the delay time dt by the number of stages D of the delay cells 50 is substantially equal to the semi-cycle T/2 of the VCO 4 cycle T.

When the PLL circuit 3 is locked, the delay time dt is represented by the following equation (3) based on the cycle T = 1/f1 and the aforementioned equation (1).

$$dt = (M/N) \cdot (1/2D \cdot f0) \qquad (3)$$

When the number of stages D of the delay cells 50 and 51 and the frequency division ratios M and N are determined, the delay time dt of the delay cells 50 is set to a constant value that depends on only the frequency f0 of the reference signal RFCK.

The delay cell 60 of the delay line 2 has the same configuration as the delay cell 50 of the VCO 4, and the same control voltage Vt is supplied to the delay cells 50 and 60. Accordingly, the delay time of the delay cells 50 and 60 is substantially the same.

The input signal SIN is sequentially delayed by the delay cell 60, and the single delay output SOUT is selected using the selector 20. When the PLL circuit 3 is locked, the delay time dt of each delay cell 60 is set to a constant value so that a delay signal delayed by a constant delay time is output from the selector 20. This eliminates the need for adjusting the delay line 2 during manufacture and allows the delay time to be set with the guaranteed accuracy of the PLL circuit 3. As a result, a highly accurate delay time is set in psec order. Moreover, the PLL circuit 3 is also hardly affected by power fluctuation and temperature fluctuation, and so the delay time of the delay line 2 is also hardly affected by these fluctuations.

The delay time dt is easily changed in accordance with the frequency f0 of the reference signal RFCK and the frequency division ratios M and N. This facilitates the setting of the resolution of the delay line 2. For example, when the number of stages D of the delay cell 50 is set to "16", each of the frequency division ratios M and N is set to "2", and f0 is set to "17.28 MHz", then the delay time dt "1.81 nsec" is obtained from the aforementioned equation (3). When each frequency division ratio is set to "4" and f0 is set to "34.56 MHz", the delay time dt "0.90 nsec" is obtained. In this case, the resolution of the delay line 2 is in psec order.

Figure 10A:
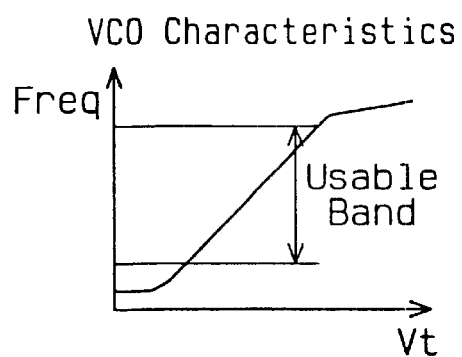
FIG. 10($a$) is a graph showing VCO characteristics and FIG. 10($b$) is a graph showing delay characteristics.
Figure 10B:
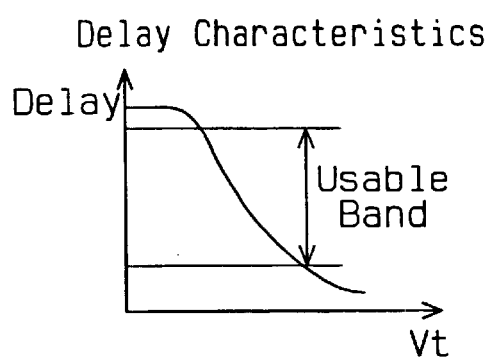

FIG. 10(*a*) is a graph showing characteristics of the VCO 4, and FIG. 10(*b*) is a graph showing delay characteristics. The frequency range in which the PLL 3 is locked is relatively wide, and the delay time dt of the delay cells can be set within the frequency range. Accordingly, the delay time setting range of the delay line 2 is wide.

It should be apparent to those skilled in the art that the present invention may be embodied in many other specific forms without departing from the spirit or scope of the invention. Particularly, it should be understood that the invention may be embodied in the following forms.

Comparators may be used instead of the inverters 101 and 102 of the delay cells 50, 51, and 60. Further, the control voltage Vt from the low pass filter 8 may be supplied to the current-controlled transistors 105 to 108.

Therefore, the present examples and embodiments are to be considered illustrative and not restrictive and the invention is not to be limited to the details given herein, but may be modified within the scope and equivalence of the appended claims.

What is claimed is:

1. A pulse delay circuit, comprising:
    a plurality of first synchronous circuits for receiving a plurality of input pulse signals and a clock signal and generating a plurality of first synchronous input pulse signals that are synchronized with the clock signal;
    a delay circuit including a plurality of series connected delay elements for delaying the clock signal and generating a plurality of delay clock signals;
    a plurality of selectors, connected in parallel to the delay circuit, each of which is connected to the plurality of delay elements, each of the selectors selecting one of the plurality of the delay clock signals in accordance with an associated selection signal; and
    a plurality of second synchronous circuits, connected to the plurality of first synchronous circuits and the plurality of selectors, respectively, for receiving the plurality of first synchronous input pulse signals and the selected delay clock signals and generating a plurality of second synchronous pulse signals that are synchronized with the selected delay clock signals, respectively.

2. The circuit of claim 1, wherein each of the plurality of delay elements is an inverter.

3. The circuit of claim 1, wherein each of the plurality of delay elements is a comparator.

4. A pulse signal control circuit, comprising:
    a first synchronous circuit for receiving an input signal and a clock signal and generating a first synchronous input signal that is synchronized with the clock signal;
    a waveform shaping circuit, connected to the first synchronous circuit, for waveform-shaping the first synchronous input signal and generating a waveform-shaped input signal;
    a plurality of second synchronous circuits for receiving a plurality of input pulse signals and the clock signal and generating a plurality of second synchronous input pulse signals that are synchronized with the clock signal;

a delay circuit including a plurality of delay elements for delaying the clock signal and generating a plurality of delay clock signals;

a plurality of selectors, each of which is connected to the plurality of delay elements, each of the selectors selecting one of the plurality of delay clock signals in accordance with an associated selection signal;

a plurality of third synchronous circuits, connected to the plurality of second synchronous circuits and the plurality of selectors, for receiving the plurality of second synchronous input pulse signals and the selected delay clock signals and generating a plurality of third synchronous input pulse signals that are synchronized with the selected delay clock signals, respectively; and a plurality of logic circuits, connected to the waveform shaping circuit and the plurality of third synchronous circuits, for receiving the waveform-shaped input signal and the plurality of third synchronous input pulse signals and generating a plurality of pulse signals that are synchronized with the waveform-shaped input signal.

5. The pulse control circuit of claim 4, wherein the waveform shaping circuit includes:

a second delay circuit including a plurality of second delay elements for delaying the synchronous input signal and generating a plurality of delay synchronous input signals; and a second selector, connected to the plurality of second delay elements, for selecting one of the plurality of delay synchronous input signals in accordance with a second selection signal.

6. The pulse control circuit of claim 5, wherein the waveform shaping circuit further includes a second logic circuit for receiving the synchronous input signal and the selected delay synchronous input signal and generating the waveform-shaped input signal.

* * * * *